United States Patent [19]
Worley et al.

[11] Patent Number: 6,088,256
[45] Date of Patent: Jul. 11, 2000

[54] INTEGRATED CIRCUIT WITH ELECTRICALLY PROGRAMMABLE FUSE RESISTOR

[75] Inventors: James Leon Worley, Flower Mound; Duane Giles Laurent, Lewisville; Elmer Henry Guritz, Flower Mound, all of Tex.

[73] Assignee: STMicroelectronics, Inc., Carrollton, Tex.

[21] Appl. No.: 09/160,404

[22] Filed: Sep. 25, 1998

[51] Int. Cl.[7] .................................................. G11C 17/00
[52] U.S. Cl. ............................ 365/96; 365/201; 365/210
[58] Field of Search .............................. 365/148, 96, 201, 365/182, 210

[56] References Cited

U.S. PATENT DOCUMENTS 5,956,274  9/1999  Elliott et al. ............................. 365/210

*Primary Examiner*—Terrell W. Fears
*Attorney, Agent, or Firm*—Theodore E. Galanthay; Lisa K. Jorgenson; Peter J. Thoma

[57] ABSTRACT

Composite layers of titanium silicide and polysilicon define a fuse resistor within a programmable fuse element that increases its resistance from about 50 ohms in the unprogrammed state to about 250 K-ohms in the programmed state by creating a discontinuity in the silicide layer immediately over a PN junction in the polysilicon layer. The resistance of the fuse resistor in the programmed state is determined by the reverse-biased diode characteristic of the PN junction. Portions of a metallic layer overlie portions of the fuse resistor except at the site of the PN junction in the polysilicon layer so that the silicide is preferentially heated immediately above the PN junction to cause the discontinuity to occur at that site. The metallic layer portions serve both as a heat sink for the underlying portions of the silicide layer and as electrical connections to the fuse resistor.

20 Claims, 2 Drawing Sheets

6,088,256

INTEGRATED CIRCUIT WITH ELECTRICALLY PROGRAMMABLE FUSE RESISTOR

BACKGROUND OF THE INVENTION

The present invention relates generally to integrated circuit devices that include one or more programmable fuse elements. More particularly, the present invention relates to fuse structures in integrated circuits and techniques for programming integrated circuits by electrically altering the conductive state of one or more such fuse structures.

The use of fuses in integrated circuits is well known in the art. U.S. Pat. No. 3,792,319 discloses an early example of a polycrystalline silicon fusible link, which is "blown" or programmed by passing electrical current through the fusible link. Fuses that are programmed by selective irradiation are also known in the art. For example, U.S. Pat. No. 4,503,315 discloses a fuse that is programmed by exposure to a laser beam.

A common application for such fuses is the deselection of rows or columns of memory cells in dynamic random access memories (DRAMs) or static random access memories (SRAMs) that contain a defective memory cell and the substitution of respective redundant rows or columns. U.S. Pat. No. 5,771,195 discloses such a technique.

Since the introduction of polycrystalline silicon (or "polysilicon") fuses, improvements have been made in electrically programmable fuses. U.S. Pat. No. 5,789,970 discloses a composite fuse structure of silicide and polysilicon that includes PN junctions in the polysilicon layer for increasing the resistance of the fuse in the programmed state. A discontinuity is formed in the silicide over one of the PN junctions causing a large increase in resistance from the unprogrammed state to the programmed state. A further improvement is achieved by the present invention.

SUMMARY OF THE INVENTION

An important objective of the present invention is to provide a programmable fuse element that can be programmed to consistently provide a predictable change in resistance of several orders of magnitude for on-chip programming of an integrated circuit device The programmable fuse element comprises composite layers of silicide and polysilicon, and a heat sink disposed above and insulated from the silicide layer. A PN junction is included in the polysilicon layer. The composite layers of silicide and polysilicon form a fuse resistor whose resistance can be electrically altered from an unprogrammed state to a programmed state. The heat sink is configured to conduct thermal energy during programming from portions of the silicide layer spaced from the PN junction so that heat is concentrated in the silicide layer directly over the PN junction.

During programming, current is applied to the fuse resistor to preferentially heat the silicide layer directly over the PN junction thereby causing the silicide to become essentially nonconductive at that point. Once programmed in this manner, the circuit in which the fuse resistor is incorporated sees a very high resistance value determined by the characteristic of the reversed-biased PN junction. In the unprogrammed state the fuse resistor provides a very low resistance since the uninterrupted silicide shunts or bypasses the PN junction. Therefore, programming causes the circuit to see a greatly increased resistance through the fuse resistor, which is easily detectible.

Additional objectives of the present invention and its advantages will become apparent from the following description of the preferred embodiments as illustrated in the accompanying drawings.

DESCRIPTION OF THE PREFERRED EMBODIMENTS

Figure 1:
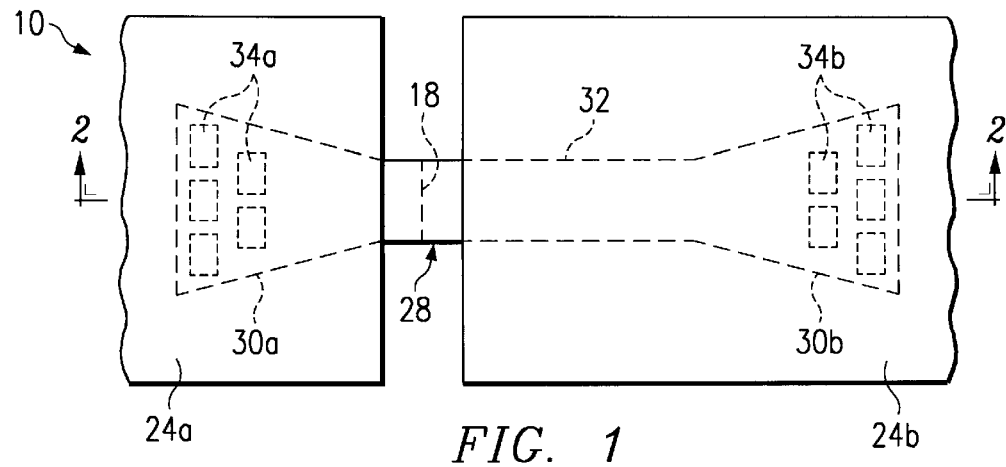
FIG. 1 is a schematic plan view of a programmable fuse element that includes the fuse resistor of the present invention.
Figure 2:
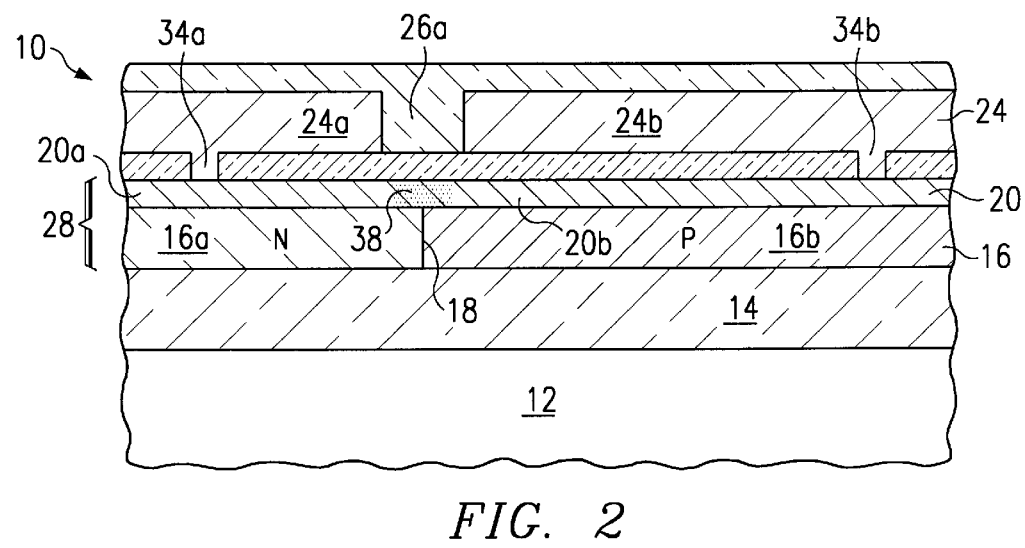
FIG. 2 is a schematic cross-section taken along line 2—2 of FIG. 1.
Figure 3:
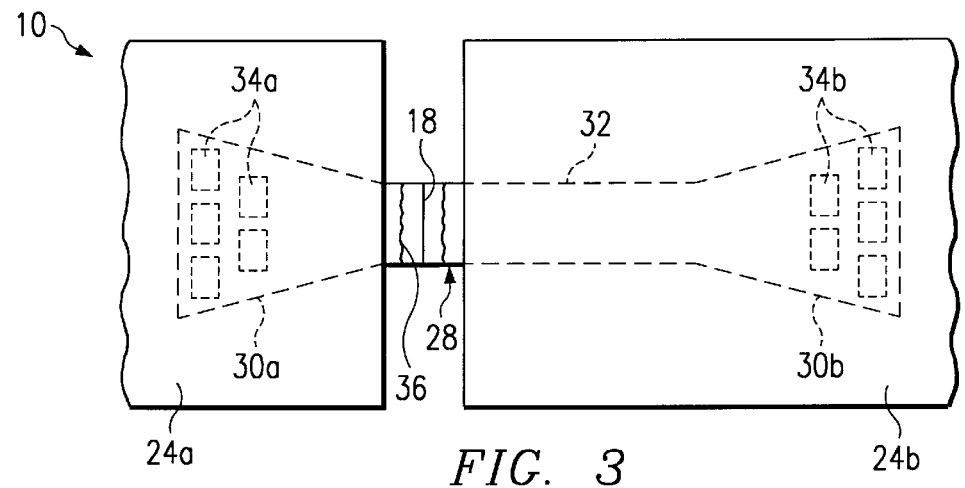
FIG. 3 is a schematic plan view of the programmable fuse element of FIG. 1 after it has been programmed showing a discontinuity in the material of the fuse resistor revealing an underlying PN junction.

In accordance with the present invention, an improved programmable fuse element is illustrated in FIGS. 1 and 2 in its unprogrammed state and in FIG. 3 in its programmed state, and is designated generally by reference numeral 10. As indicated by the broken edges of the figures, the programmable element 10 is part of a larger integrated circuit semiconductor chip. The programmable fuse element 10 can be fabricated using conventional semiconductor processing techniques. With particular reference to FIG. 2, the programmable fuse element 10 is formed above a monolithic semiconductor substrate 12, which provides the common substrate for the entire integrated circuit chip. The substrate 12 preferably comprises monocrystalline silicon as typically used in fabricating conventional integrated circuit devices. The integrated circuit chip includes active areas (not shown) that arc isolated from each other by a field oxide layer 14, which is typically about 4000 Å thick. The programmable fuse element 10 is preferably constructed atop a portion of the field oxide 14 as shown in FIG. 2. The field oxide 14 forms an 10 insulating layer for electrically and thermally insulating the programmable fuse element 10 from the substrate 12. The field oxide 14 is preferably silicon dioxide formed using conventional local oxidation of silicon (LOCOS) fabrication techniques.

Disposed on the field oxide 14 is a polysilicon layer 16, which includes an N-type region 16a and P-type region 16b defining a PN junction 18. The polysilicon layer 16 is preferably deposited using conventional chemical vapor deposition (CVD) techniques. After deposition, the polysilicon layer 16 is selectively doped with a heavy dose of boron using conventional ion implantation techniques, preferably during formation of P-channel transistor source and drain regions (not shown). This produces P-type region 16b. During the boron implantation step, the region 16a is masked, preferably by photoresist, to prevent its being doped. Subsequently, the polysilicon layer 16 is selectively implanted with a heavy dose of an N-type dopant, such as arsenic, in the area shown as N-type region 16a while region 16b is covered with a mask layer. N-Channel transistor source and drain regions may be formed during this N-type implant step at other locations (not shown) on the chip.

Of course, it will be understood that the chip fabrication steps described herein are carried out on an entire wafer containing multiple chips or die in accordance with conventional semiconductor manufacturing techniques. After processing and testing of the individual die on the wafer, the die are separated and those that are determined to be fully functional are encapsulated in protective housings or packages with external leads connected to the die inside. The finished package is known as an integrated circuit device or IC.

The programmable fuse element 10 also includes a silicide layer 20 formed atop the polysilicon layer 16 to a thickness of about 2400 Å. In the preferred embodiment, the silicide layer 20 consists essentially of titanium silicide although other silicides may be used, such as tungsten, or tantalum silicide. A dielectric layer 22, preferably a CVD oxide, lies atop the silicide layer 20. The dielectric layer 22 is preferably about one-half the thickness of the field oxide layer 14. A metallic layer 24, which is preferably tungsten, but alternatively may be aluminum, is deposited atop the dielectric layer 22. A glass layer 26 covers the metallic layer 24. A conventional spun-on glass (SOG) may be used to form the layer 26.

With reference to the structure shown in FIG. 2, the composite layers of the polysilicon layer 16 and silicide layer 20 form a fuse resistor, designated generally by reference numeral 28. In plan view as depicted in FIGS. 1 and 3, the fuse resistor 28 is seen to have a barbell-like shape with wide ends 30a and 30b and a narrow intermediate strip 32. The narrow strip 32 is preferably only as wide as the minimum feature size of the integrated circuit chip, which is determined by the process technology. Present-day processes can achieve submicron line widths for features such as the narrow strip 32. It is in the narrow strip 32 of the fuse resistor 28 that current concentration during programming causes heat to effect the fuse action. In the wide ends 30a and 30b there are groups of contacts 34a and 34b that interconnect the metallic layer 24 to the silicide layer 22. This is apparent from FIG. 2, which shows contact 34a passing through the dielectric layer 22 on the left side and contact 34b passing through dielectric layer 22 on the right side.

In accordance with an important feature of the present invention, the metallic layer 24 serves the dual purpose of providing electrical connection to the silicide layer 20 and acts as a heat sink during programming of the fuse resistor 28. The metallic layer 24 has two portions designated 24a and 24b separated by a dielectric spacer 26a, which preferably comprises a downward extending portion of the glass layer 26. It will be understood that further layers of conductors and insulators can be built up atop the glass layer 26. The width of the spacer 26a defining the space between the facing ends of the conductor portions 24a and 24b is preferably one to two times, most preferably about 1.5 times, the width of the narrow strip 32.

In operation, the fuse resistor 28 has a first resistance before it is programmed and a second resistance after it is programmed. The first resistance is determined by the resistance of the silicide layer 20 and is typically about 50 ohms in the preferred embodiment. The fuse resistor 28 is programmed by passing a current through the silicide layer 20 via contacts 34a and 34b. Thermal energy resulting from this programming current will cause the silicide layer 20 to develop a discontinuity 36 as illustrated schematically in FIG. 3. This is analogous to blowing a standard discrete fuse. In FIG. 2, the corresponding location of discontinuity 36 is indicated by the stippled area 38 in silicide layer 22. The discontinuity 36 separates the silicide layer 20 into a left portion 20a and a right portion 20b. The discontinuity 36 will form over the PN junction 18 because of the thermally-conductive relationship between the metallic layer 24 and the silicide layer 20, which are separated only by the relatively thin dielectric layer 22, which is preferably about 2000 Å thick. Heat created by the programming current is dissipated by the metallic layer 24, which serves as a thermally efficient heat sink during programming. However, since the dielectric spacer 26a is present over the PN junction 18, thermal energy will concentrate in that region of the silicide layer 20 resulting in the discontinuity 36 at that point.

After programming, the current between metallic portions 24a and 24b flows through contacts 34a down into silicide portion 20a, laterally through silicide portion 20a to the discontinuity 36, down into the polysilicon layer 16, through the PN junction 18 therein, back up into the silicide portion 20b, laterally to contacts 34b and finally up and through metallic layer portion 24b. Therefore, the resistance after programming is determined by the reverse-biased diode characteristic of PN junction 18 in the polysilicon layer 16. Because the discontinuity 36 is formed over the PN junction 18, the resistance after programming will be significantly higher (typically in excess of 250,000 ohms) than the resistance before programming.

Various applications for the present invention are possible as will be recognized by those skilled in the art. One advantageous application for the programmable fuse element 10 is the deselection of rows or columns of memory cells in random access memories, such as DRAMs and SRAMs. If a row or column is found to contain a defective memory cell, it can be deselected and a redundant row or column substituted.

Figure 4:
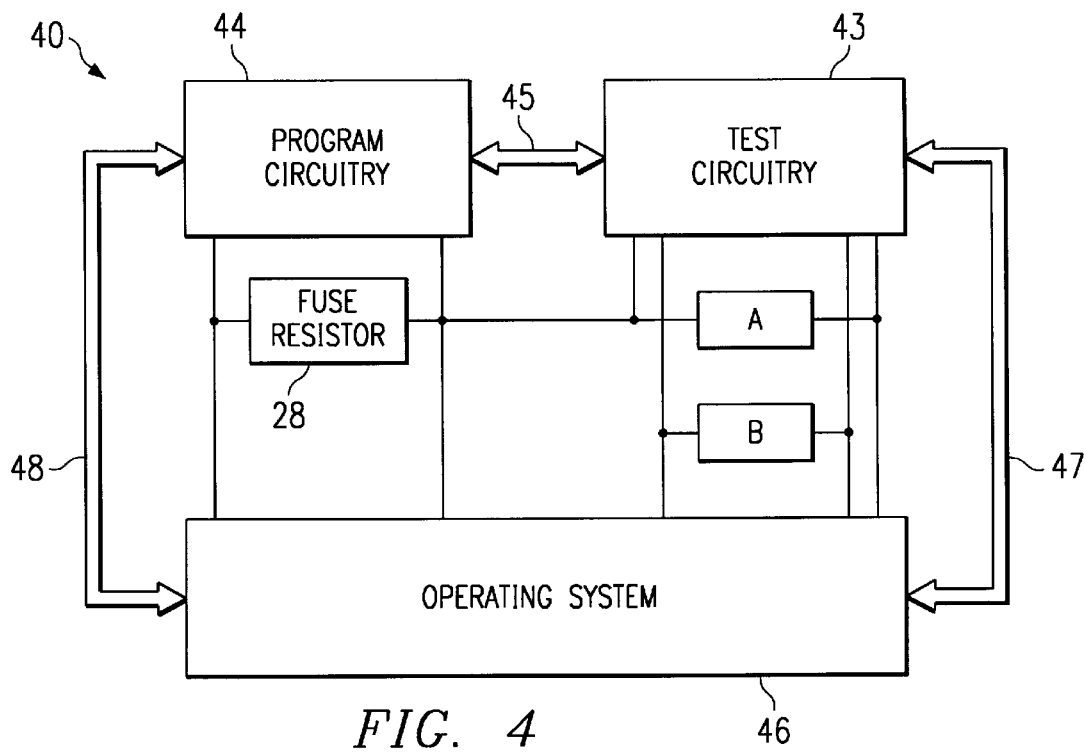
FIG. 4 is a circuit diagram with the fuse resistor of the present invention incorporated in a subcircuit of an integrated circuit device.

With reference to FIG. 4, a generalized application for the present invention will now be described. A subcircuit of integrated circuit chip is designated generally by reference numeral 40, which includes the fuse resistor of the present invention depicted as a circuit block 28. In series with the fuse resistor 28 is a primary circuit A that may be a row or a column in a memory array of a random access memory. There are many such rows and columns in a typical memory array. In the event that a manufacturing defect is detected in the primary circuit A (such as a defective memory cell), a redundant circuit B is available for substitution.

In order to determine whether the redundant circuit B should be substituted for the primary circuit A in the final integrated circuit device, test circuitry shown generally in circuit block 43 is preferably provided on the integrated circuit chip. Various different forms of on-chip test circuitry are known in the art and are sometimes referred to as built-in-self-test or "BIST" circuitry. It will be appreciated that off-chip test circuitry may be used as an alternative. In the subcircuit 40 of FIG. 4, the test circuitry 43 has access to both primary circuit A and redundant circuit B, as indicated by the interconnecting conductors. At a near-final stage in the fabrication process. individual chips or die on each wafer are probed by test equipment and taken through a sequence of tests to determine the viability of the circuits and circuit elements on each chip. If it is determined that the primary circuit A is defective and that the redundant circuit B is fully functional, the test circuitry 43 signals program circuitry 44 through a bus 45 to program the fuse resistor 28. During the testing and programming operations, an on-chip operating system 46 communicates with the test circuitry 43 through a bus 47 and with the program circuitry 44 through another bus 48. The operating system 46 also has access to the series-connected fuse resistor 28 and primary circuit A as well as the redundant circuit B through interconnecting conductors as shown.

Programming of the fuse resistor 28 is accomplished as described above in connection with FIGS. 1–3 by passing a programming current through the fuse resistor to cause the discontinuity 36 to occur in the silicide layer 20. As a result, the fuse resistor 28 has its resistance increased from a very low value, typically about 50 ohms, to a very high value, typically on the order of 250 K-ohms or more.

Figure 5:
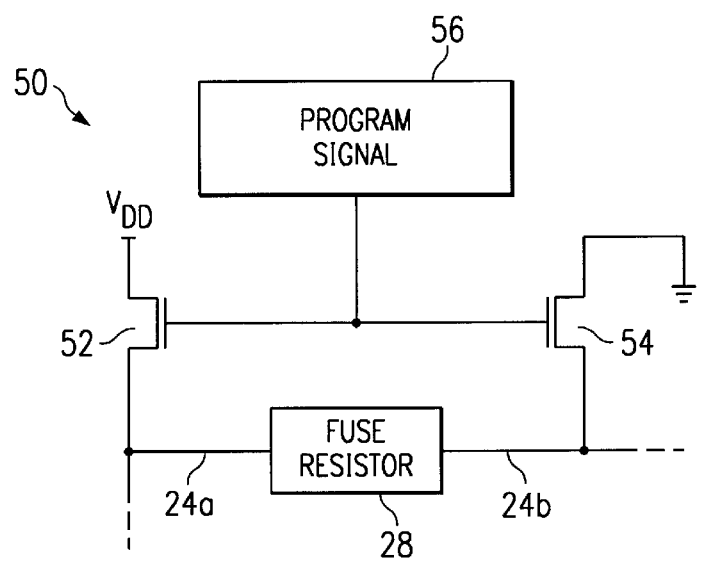
FIG. 5 is a diagram of circuitry for programming the fuse resistor.

A technique for programming the fuse resistor 28 will now be described with reference to FIG. 5, showing a portion 50 of the program circuitry 44 of FIG. 4. A first transistor 52 is connected between a positive voltage supply node designated $V_{DD}$ and the fuse resistor 28. The connection is made through conductor 24a. A second transistor 54 is connected between a ground supply node and conductor 24b of the fuse resistor 28. Conductors 24a and 24b are shown in cross section in FIG. 2. Transistors 52 and 54 are large enough to conduct sufficient current through the fuse resistor 28 to heat the silicide layer 20 in the portion 38 over the PN junction 18 as depicted in FIG. 2.

As shown in FIG. 5, a program signal 56 generated by the test circuitry 43 is applied to the gates of transistors 52 and 54 when the determination is made to program the fuse resistor 28. Transistors 52 and 54 are preferably N-channel transistors requiring the program signal 56 to be positive to program the fuse resistor 28. It will be recognized that variations in the implementation of circuitry for programming the fuse resistor 28 are possible, the circuit 50 being one example.

Referring again to FIG. 4, after the fuse resistor 28 has been programmed to deselect the primary circuit A, the operating system 46 will employ redundant circuit B in place of circuit A. The operating system 46 detects the state of the fuse resistor 28 as either in its low resistance unprogrammed state or high resistance programmed state. In the case of implementation in a random access memory for replacing a defective row or column, address circuitry (not shown) in the operating system is logically configured to address the redundant row or column (i.e., redundant circuit B) in place of the defective row or column (i.e., primary circuit A) when it detects that the fuse resistor 28 is in its high resistance state.

The present invention is particularly useful with complex integrated circuit devices such as microprocessors that include what is referred to as an embedded DRAM. The expense of such complex IC devices warrants the use of programmable redundancy as described herein to increase the manufacturing yield of such devices. It is believed that one percent redundancy is sufficient with reasonably well-controlled fabrication processes. In other words, for a one megabit embedded DRAM having 1024 rows and 1024 columns, ten redundant columns are sufficient to provide a significant increase in manufacturing yield without committing too much additional chip area to the redundant columns and associated test and program circuitry.

It will be appreciated from the foregoing description that the present invention provides a significant improvement over the prior art. Referring again to FIG. 3, the location of the metallic conductors 24a and 24b relative to the underlying silicide/polysilicon structure of the fuse resistor 28 preferentially causes heating of the silicide layer 20 immediately over the PN junction 18. This enables programming to occur in a predictable manner so that the discontinuity 36 in the silicide layer 20 will repeatedly occur over the PN junction. Therefore, the change in resistance of the fuse resistor 28 from the unprogrammed state to the programmed state consistently will be several orders of magnitude— typically from about 50 ohms to about 250 K-ohms. The very large resistance in the programmed state is due to the effect of the reverse-biased PN junction. If the discontinuity in the silicide were to occur at a location removed from the PN junction, silicide would remain over and shunt the PN junction, thereby eliminating its contribution to very high resistance of the fuse resistor in the programmed state. The very large increase in resistance of several orders of magnitude provided by the PN junction 18 facilitates detection of the state of the fuse resistor 28 by the operating system 46.

Although preferred embodiments of the present invention are described herein, it will be appreciated by those skilled in the art that various changes and substitutions may be made without departing from the spirit and scope of the present invention as set forth in the appended claims.

What is claimed is:

1. An integrated circuit device comprising:

(a) a semiconductor substrate;

(b) a first insulating layer disposed on the substrate;

(c) a fuse resistor disposed on the first insulating layer, the fuse resistor having a polysilicon layer and an adjoining silicide layer, the polysilicon layer including an N-type portion and a P-type portion meeting at a PN junction;

(d) a heat sink disposed above portions of the silicide layer in a thermally conductive relationship to the silicide layer, the heat sink defining a predetermined area of the silicide layer above the PN junction for concentration of thermal energy during programming;

(e) circuitry connected to the fuse resistor for programming the fuse resistor by passing a current therethrough to preferentially heat the silicide layer in the predetermined area such that a discontinuity is created in the silicide layer above the PN junction; and (f) circuitry for detecting the state of the fuse resistor.

2. The integrated circuit device as set forth in claim 1 wherein the heat sink comprises a metallic layer disposed adjacent to and insulated from the silicide layer, the metallic layer having first and second portions separated by a space corresponding to the predetermined area, the metallic layer being configured to conduct thermal energy away from the silicide layer immediately beneath the first and second portions so that the predetermined area of the silicide layer is preferentially heated during programming.

3. The integrated circuit device as set forth in claim 2 wherein the silicide layer is selected from the group consisting of titanium silicide, tungsten silicide and tantalum silicide.

4. The integrated circuit device as set forth in claim 2 wherein the silicide layer consists essentially of titanium silicide.

5. The integrated circuit device as set forth in claim 2 wherein the first and second portions of the metallic layer are separated from the underlying silicide layer by a second insulating layer that is about one-half the thickness of the first insulating layer.

6. The integrated circuit device as set forth in claim 5 wherein the first insulating layer comprises a LOCOS field oxide of about 4000 Å in thickness.

7. An integrated circuit device having circuitry formed on a monolithic semiconductor chip, the circuitry comprising:

an operating system;

a primary circuit connected to the operating system;

a redundant circuit connected to the operating system;

test circuitry for testing the functionality of the primary circuit and the redundant circuit;

a fuse resistor connected to the primary circuit and the operating system; and program circuitry in communication with the test circuitry and connected to the fuse resistor, the program circuitry including means for passing a programming current through the fuse resistor in response to a determination by the test circuitry that the primary circuit is defective and that the redundant circuit is functional, the programming current altering the state of the fuse resistor from an unprogrammed state characterized by a first resistance to a programmed state characterized by a second resistance, the second resistance exceeding the first resistance;

wherein the fuse resistor comprises a polysilicon layer including a PN junction therein, a silicide layer disposed atop the polysilicon layer and a heat sink disposed in a thermally conductive relationship to portions of the silicide layer spaced laterally from the PN junction, such that the programming current preferentially heats the portion of the silicide layer immediately over the PN junction, whereby programming of the fuse resistor renders the silicide layer essentially non-conductive immediately over the PN junction so that the second resistance is determined by the effective resistance of the PN junction in its reverse-biased condition.

8. The integrated circuit device of claim 7 wherein the heat sink comprises spaced-apart metallic conductors overlying the silicide layer and separated by a dielectric spacer, the dielectric spacer being aligned over the PN junction.

9. The integrated circuit device of claim 8 wherein the metallic conductors are each connected to the silicide layer and make connection between the fuse resistor and the program circuitry.

10. The integrated circuit device of claim 9 wherein the program circuitry includes a transistor in series with the fuse resistor, the transistor when enabled creating a circuit path from a power source through the fuse resistor to effect programming of the fuse resistor.

11. The integrated circuit device of claim 10 wherein the transistor is enabled by a program signal generated by the test circuitry.

12. The integrated circuit device of claim 7 wherein the primary circuit is a column of memory cells in a random access memory.

13. The integrated circuit device of claim 7 wherein the primary circuit is a row of memory cells in a random access memory.

14. A programmable fuse element in an integrated circuit device, the programmable fuse element comprising:

a composite layer of polysilicon and silicide defining a narrow strip of a predetermined width extending between first and second ends;

a PN junction formed in the polysilicon portion of the composite layer;

a first metallic conductor disposed above and electrically connected to the silicide in the first end of the composite layer;

a second metallic conductor disposed above and electrically connected to the silicide in the second end of the composite layer; and program circuitry connected to the first and second metallic conductors for selectively passing a programming current through the composite layer;

wherein the first and second metallic conductors extend from the respective first and second ends of the composite layer to define a space separating the facing ends of the first and second metallic conductors, the space being disposed above the location of the PN junction, the first and second metallic conductors being disposed in a thermally conducive relationship to the underlying silicide of the composite layer such that the silicide is preferentially heated in the narrow strip immediately above the PN junction.

15. The programmable fuse element of claim 14 wherein the space separating the facing ends of the first and second conductors is equal to about 1.5 times the width of the narrow strip.

16. The programmable fuse element of claim 15 wherein the width of the narrow strip of the composite layer corresponds to the minimum feature size on the integrated circuit device.

17. The programmable fuse element of claim 14 wherein the silicide consists essentially of titanium silicide.

18. The programmable fuse element of claim 14 wherein the metallic conductors consist essentially of tungsten.

19. The fuse resistor of claim 14 wherein the composite layer is formed atop a field oxide layer, and the field oxide layer is formed atop a monocrystalline silicon substrate.

20. The fuse resistor of claim 19 wherein the first and second metallic layers are thermally coupled to the narrow strip of the composite layer through a deposited oxide layer having a thickness of about one-half the thickness of the field oxide layer.

* * * * *